(12) United States Patent
Chung et al.

(10) Patent No.: US 6,711,016 B2
(45) Date of Patent: Mar. 23, 2004

(54) SIDE EXHAUST HEAT DISSIPATION MODULE

(75) Inventors: Chao-Tsai Chung, Taipei (TW); Po-Yao Lin, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 10/310,049

(22) Filed: Dec. 5, 2002

(65) Prior Publication Data

US 2003/0210525 A1 Nov. 13, 2003

(30) Foreign Application Priority Data

May 7, 2002 (TW) ....................... 91109435 A

(51) Int. Cl.⁷ ................................ H05K 7/20
(52) U.S. Cl. ................ 361/695; 361/697; 257/718; 257/722; 174/16.1; 174/16.3; 165/80.3; 165/122; 165/185
(58) Field of Search ................. 361/695, 697, 361/704, 707, 709, 710; 257/706, 718, 722; 174/15.1, 16.1, 16.3; 165/80.2, 80.3, 185

(56) References Cited

U.S. PATENT DOCUMENTS

| | | | | | |
|---|---|---|---|---|---|
| 5,526,875 | A | * | 6/1996 | Lin | 165/80.3 |
| 6,459,580 | B1 | * | 10/2002 | Della Fiora et al. | 361/697 |
| 6,460,609 | B1 | * | 10/2002 | Cho et al. | 165/80.3 |
| 6,478,082 | B1 | * | 11/2002 | Li | 165/185 |
| 6,498,395 | B2 | * | 12/2002 | Baek et al. | 257/722 |
| 6,501,651 | B2 | * | 12/2002 | Lin et al. | 361/697 |
| 6,533,028 | B2 | * | 3/2003 | Sato | 165/80.3 |

* cited by examiner

Primary Examiner—Boris Chervinsky
(74) Attorney, Agent, or Firm—Birch, Stewart, Kolasch & Birch, LLP

(57) ABSTRACT

A side-exhaust heat dissipation module for cooling an electronic device. The side-exhaust heat dissipation module comprises a base, a fan, a fin assembly and an airflow guiding cover. The fan is disposed on one side of the base. The fin assembly is disposed on the base and composed of a plurality of parallel fins. The fin assembly has a concave end spaced from the fan by a predetermined distance. The airflow guiding cover is disposed on the fin assembly. The airflow guiding cover is gradually expanded and extended from the fan to cover the fin assembly.

18 Claims, 10 Drawing Sheets

SIDE EXHAUST HEAT DISSIPATION MODULE

BACKGROUND OF THE INVENTION

1. Field of the Invention

The present invention relates to a side-exhaust heat dissipation module, and in particular to a side-exhaust heat dissipation module for effectively cooling a CPU on a main board.

2. Description of the Related Art

Referring to FIG. 1, the conventional heat dissipation module 1 is composed of a fan 2 and a heat sink 4 with plural fins 6 formed thereon. According to the heat flow simulation analysis as shown in FIG. 2, the conventional heat dissipation module 1 has the following drawbacks.

(1) The airflow from the fan 2 flows through the heat sink 4 and flows out via opposite sides of the fins 6. Obviously, there is no airflow passing through the central area A of the heat sink 4. Thus, the efficiency of thermal exchange in the central area A is very low. The heat generated by the CPU 8 is concentrated on the central area A of the heat sink 4 and the spindle 22 of the fan 2 is located above the central area A. Thus, there is no airflow flowing through the fins 6 in the central area A and the efficiency of heat dissipation of the conventional heat dissipation module 1 is enormously reduced.

(2) The heat sink 4 has a flat bottom and the airflow form the fan 2 flows downwardly to the flat bottom. Because of the short distance between the fan 2 and the heat sink 4 and the high density of the fins 6, the airflow is subject to a high back pressure. Thus, the amount of the airflow from the fan 2 is decreased and the efficiency of heat dissipation of the conventional heat dissipation module 1 is reduced.

Referring to FIG. 3, a conventional side-exhaust heat dissipation module 50 is provided to overcome the above problems. The fan 52 of the conventional side-exhaust heat dissipation module 50 is disposed on one side of the heat sink 54. The airflow from the fan 52 can flow through the heat sink 54 completely. The heat generated on the central area of the heat sink 54 can be guided to the fins 56 and dissipated to the atmosphere via thermal convection.

Referring to FIG. 4, in the conventional side-exhaust heat dissipation module 50, the lateral sides of the fins 56 adjacent to the fan 52 are vertical and the fins 56 are closely adjacent to the fan 52. A large central circulation zone B or a stagnation zone is formed in the front portion (the portion facing the fan 52) of the fins 56. In addition, because the airflow speeds in the upper and lower portions of the fins 56 are faster and the airflow speed in the central portion of the fins 56 is slower, the airflow distribution is not uniform across the fins 56. Thus, the efficiency of heat dissipation of the conventional side-exhaust heat dissipation module 50 is not enormously enhanced as compared to that of the conventional heat dissipation module 1.

Referring to FIG. 5, in order to solve the central circulation zone B or the non-airflow zone as mentioned above, an airflow guiding cover 58 is disposed on the fins 56 and the fan 52 is spaced from the fins 56 by a distance d such that a regulation zone exists between the fan 52 and the fins 56. Thus, the central circulation zone B of FIG. 4 is reduced to a central circulation zone B' and the airflow distribution across the fins 56 is more uniform.

Referring to FIG. 6, in order to further reduce or eliminate the central circulation zone, the fan 52 can be spaced from the fins 56 by a larger and preferred distance D.

Although the efficiency of heat dissipation of the conventional side-exhaust heat dissipation module 50 is enormously enhanced since the fan 52 is spaced from the fins 56 by a preferred distance D, the total volume of the conventional side-exhaust heat dissipation module 50 increases enormously as well, thus decreasing the useful inner space in the computer.

SUMMARY OF THE INVENTION

An object of the invention is to provide a side-exhaust heat dissipation module. The side-exhaust heat dissipation module comprises a base; a fan disposed on one side of the base; a fin assembly disposed on the base and composed of a plurality of parallel fins, the fin assembly having a concave end spaced from the fan by a predetermined distance; and an airflow guiding cover disposed on the fin assembly, wherein the airflow guiding cover is gradually expanded and extended from the fan to cover the fin assembly.

A detailed description will be given by the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

Figure 1:
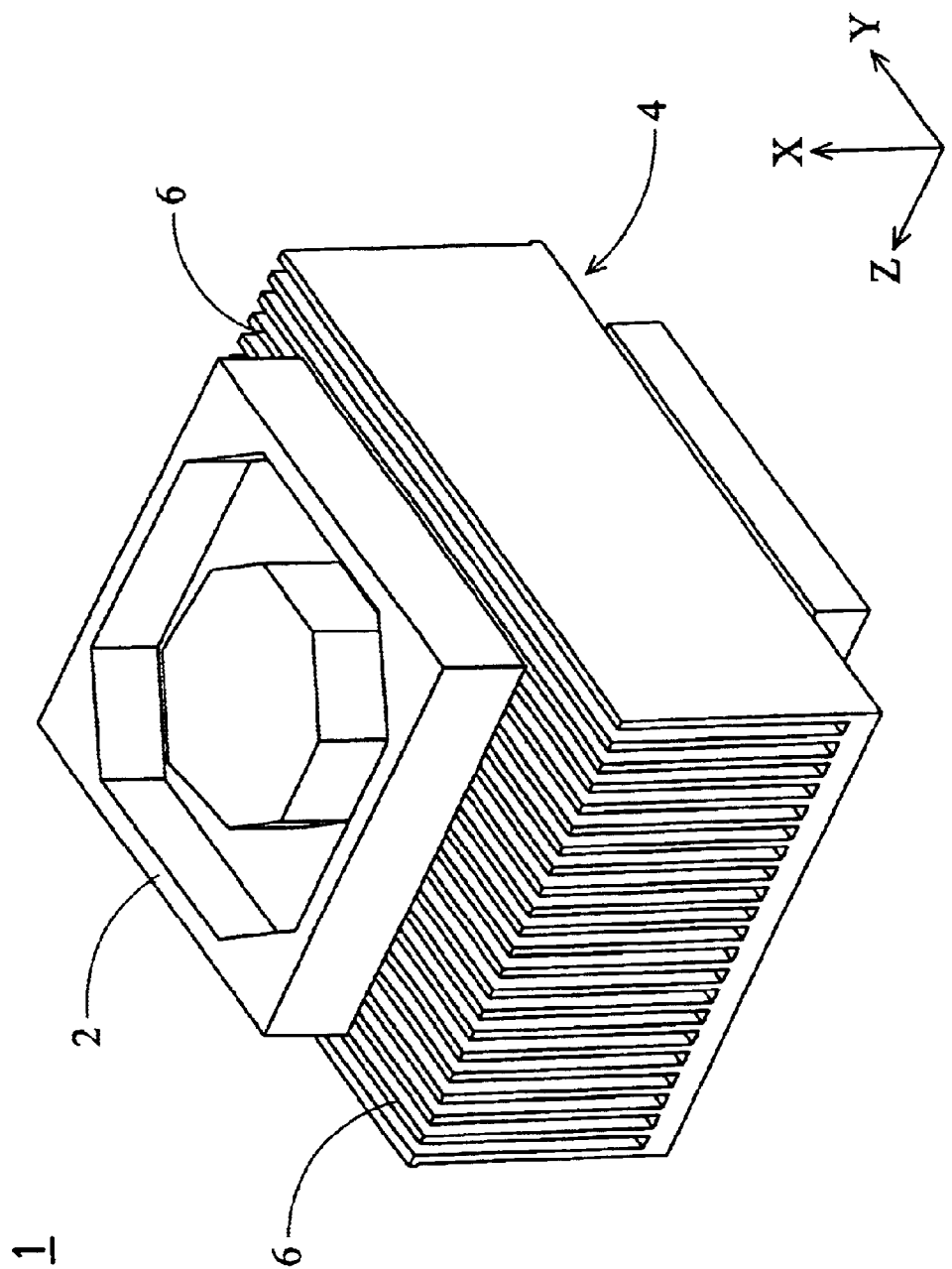
FIG. 1 shows a conventional heat dissipation module for a CPU.
Figure 2:
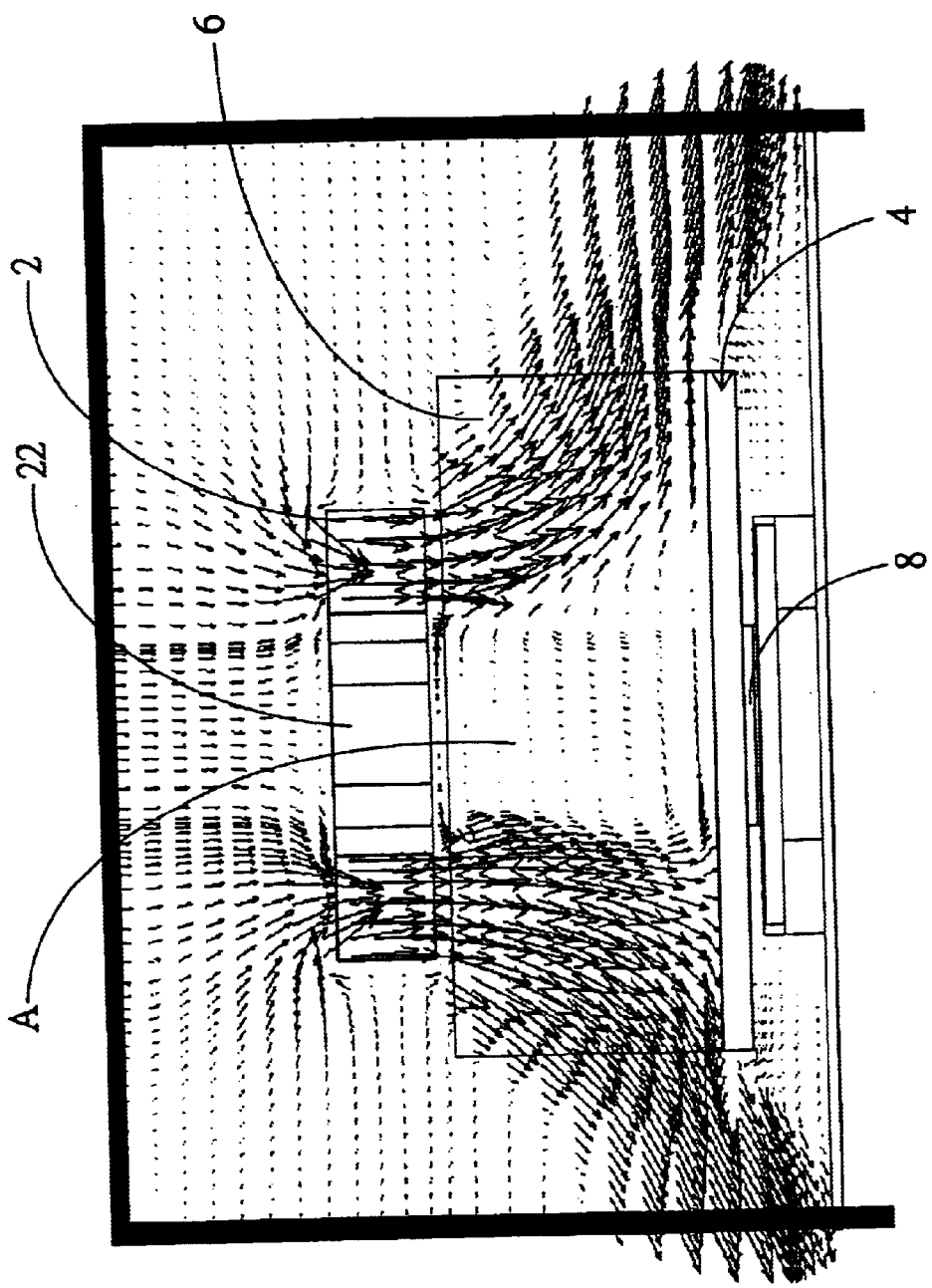
FIG. 2 shows the heat flow simulation analysis according to the conventional heat dissipation module of FIG. 1.
Figure 3:
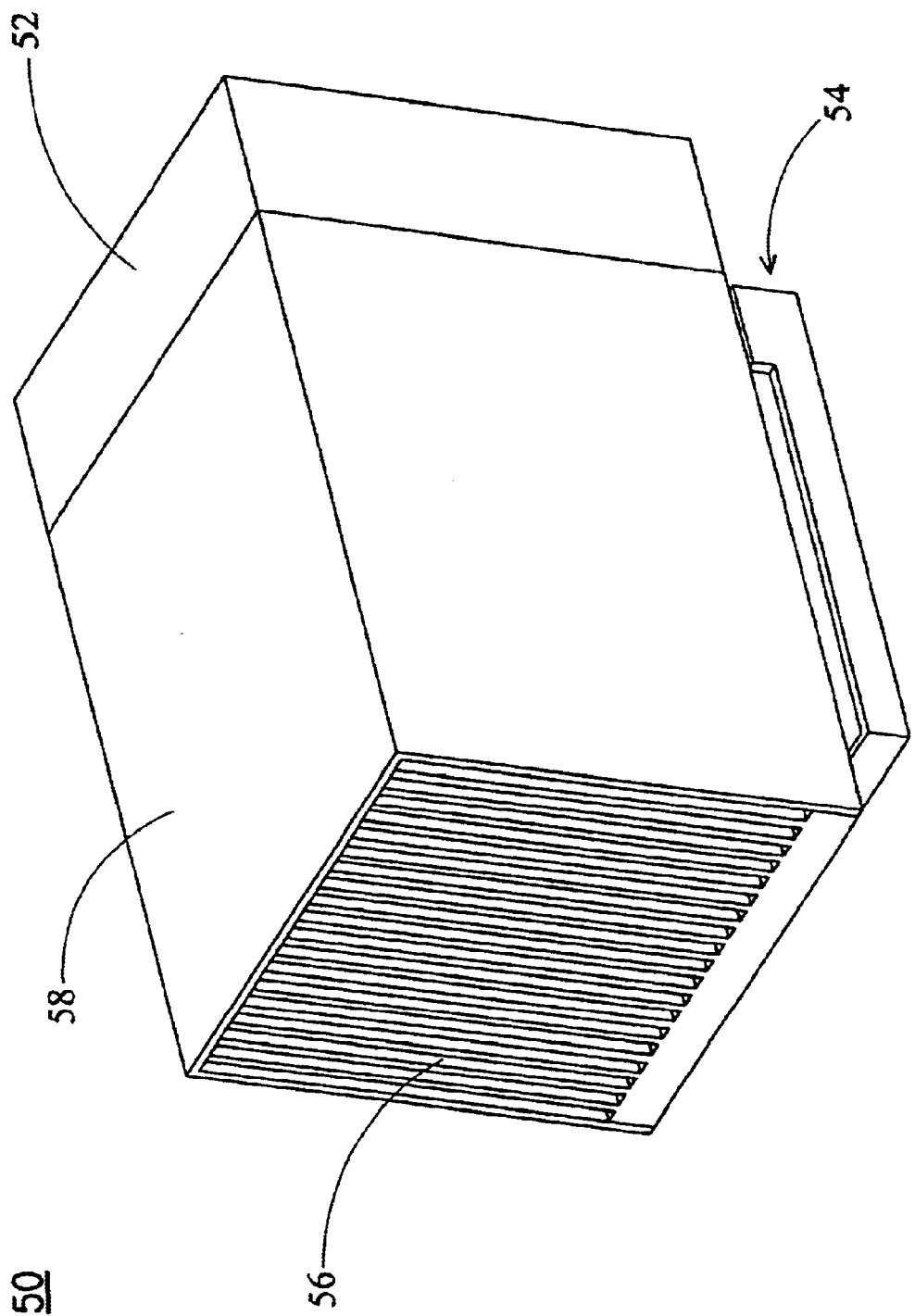
FIG. 3 shows a conventional side-exhaust heat dissipation module.
Figure 4:
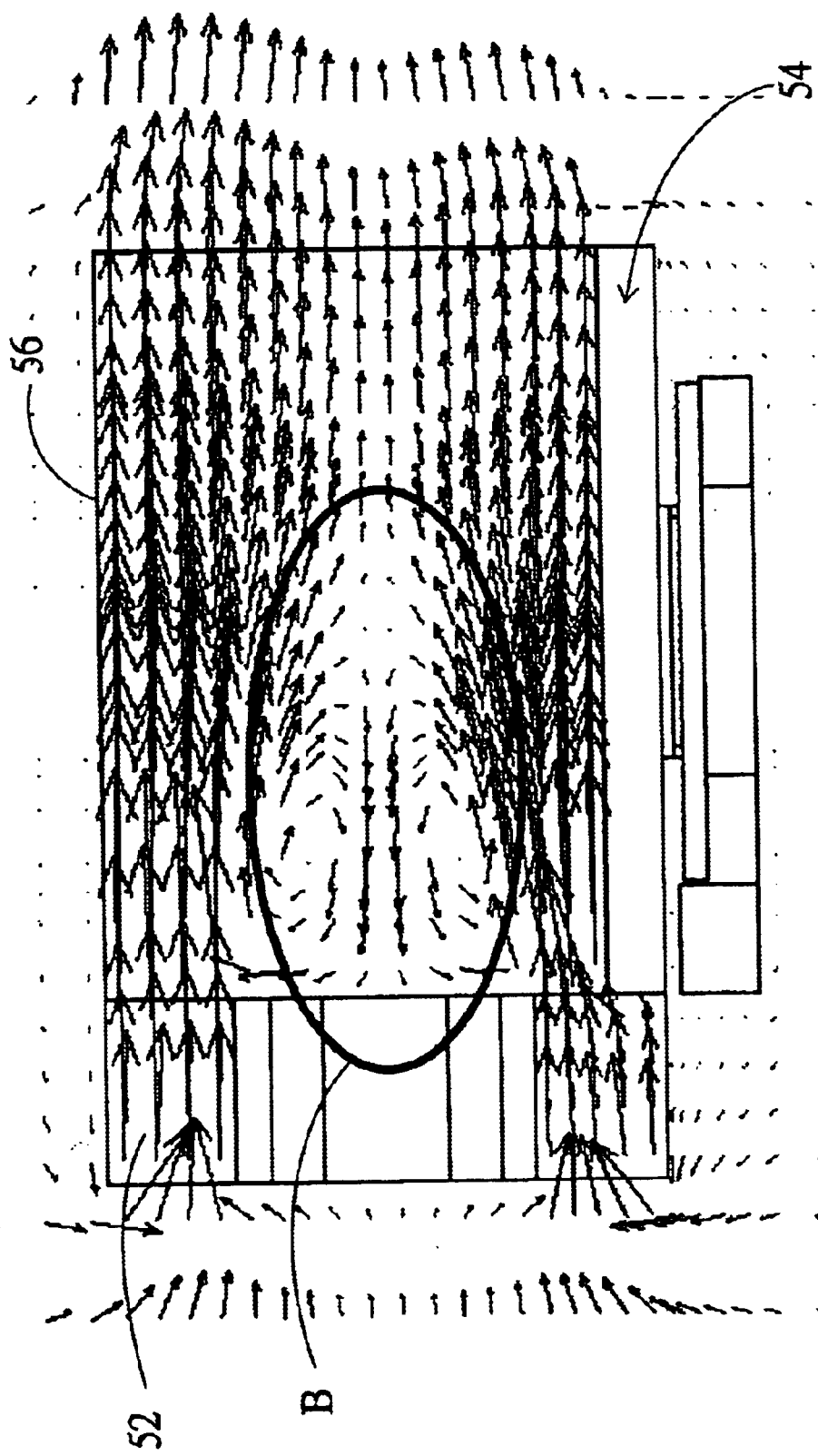
FIG. 4 shows the heat flow simulation analysis according to the conventional side-exhaust heat dissipation module of FIG. 3.
Figure 5:
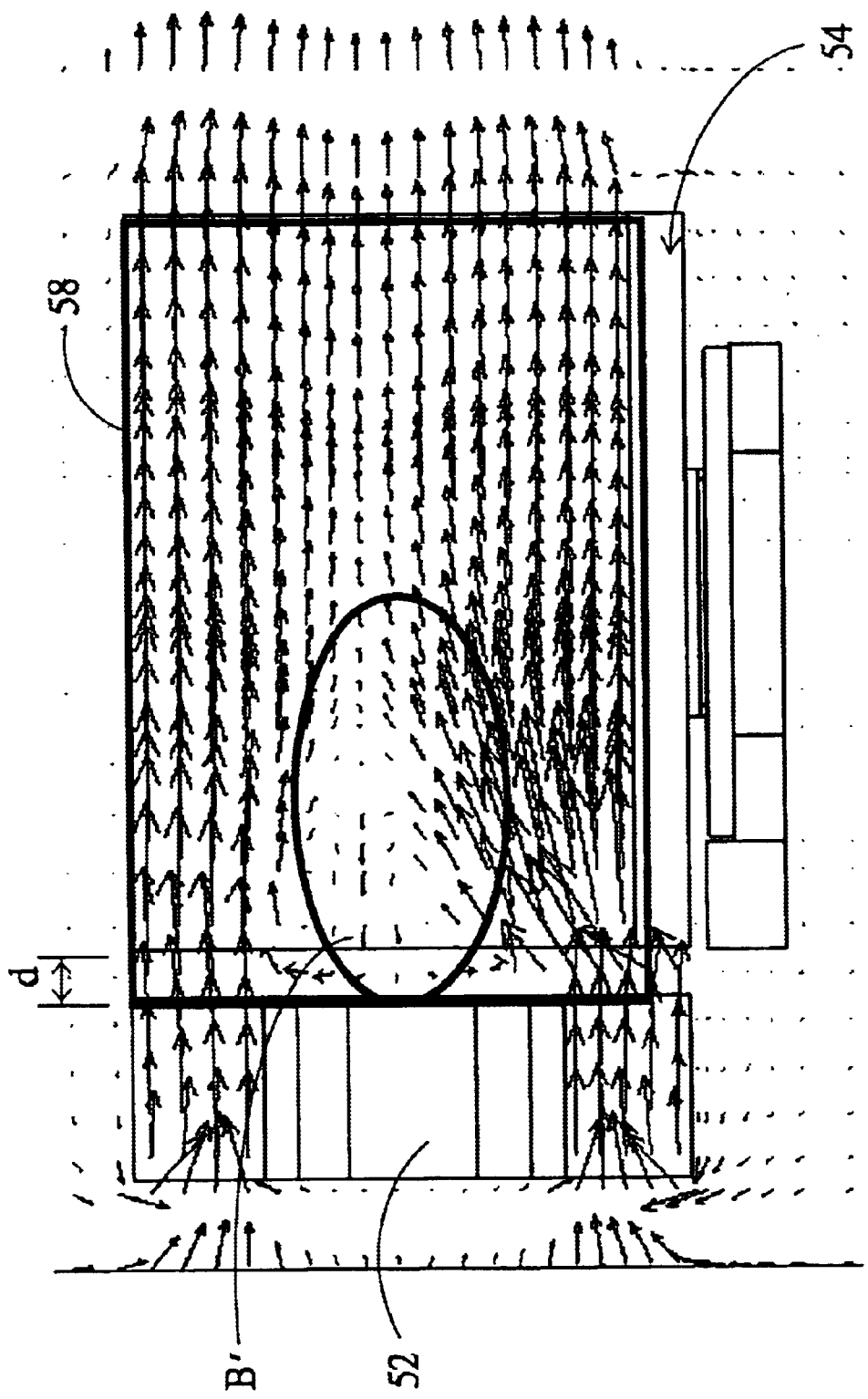
FIG. 5 shows the heat flow simulation analysis of the conventional side-exhaust heat dissipation module, wherein the fan is spaced from the fins by a distance d.
Figure 6:
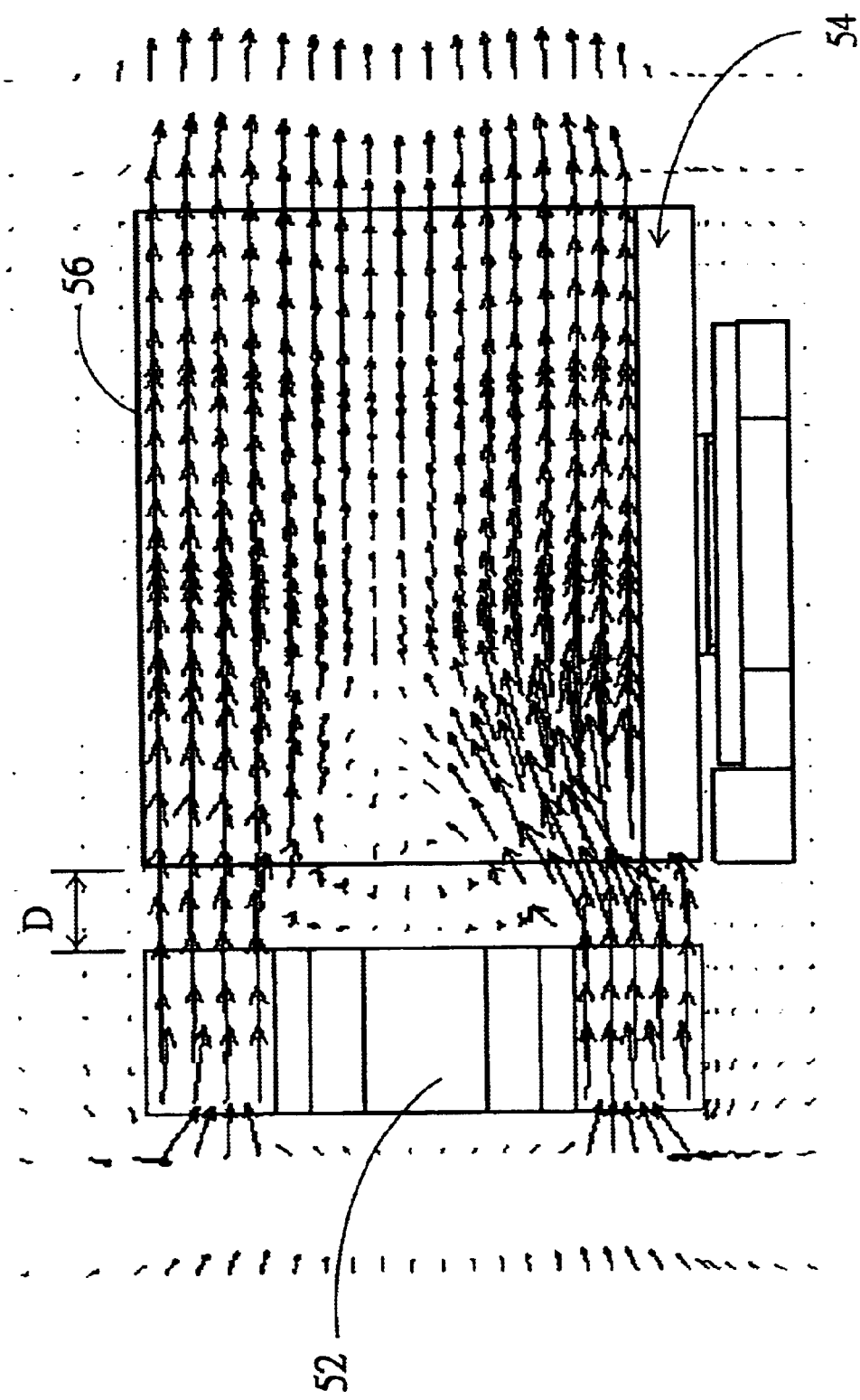
FIG. 6 shows the heat flow simulation analysis of the conventional side-exhaust heat dissipation module, wherein the fan is spaced from the fins by a preferred distance D.
Figure 7:
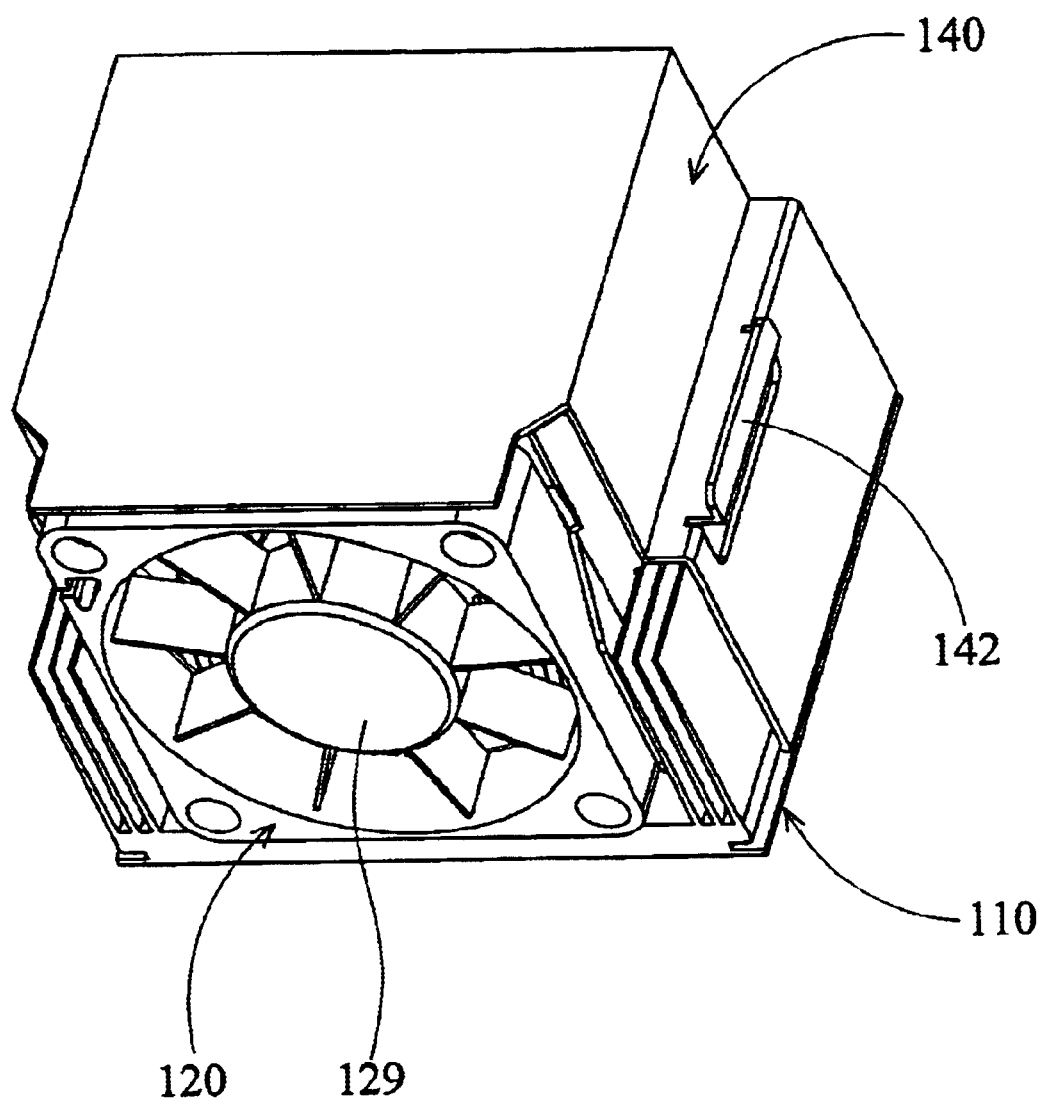
FIG. 7 shows a perspective assembly view of the present side-exhaust heat dissipation module.
Figure 8:
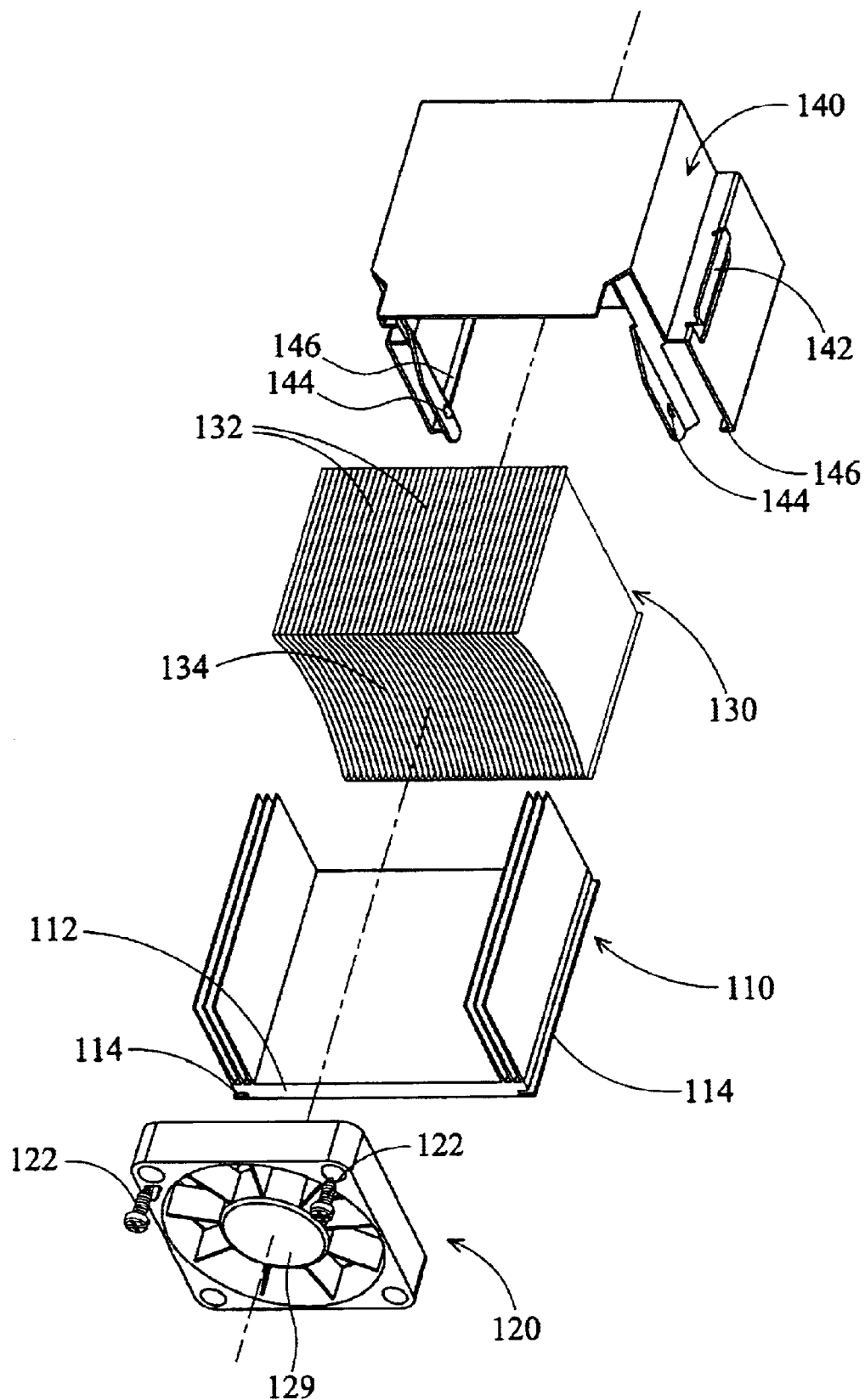
FIG. 8 shows a perspective exploded view of the present side-exhaust heat dissipation module.

Referring to FIG. 7 and FIG. 8, the side-exhaust heat dissipation module 100 comprises a base 110, a fan 120, a fin assembly 130 and an airflow guiding cover 140.

The fan 120 is disposed on one side 112 of the base 110 and fixed to the airflow guiding cover 140 by two bolts 122. The fin assembly 130 is disposed on the base 110 and composed of a plurality of parallel fins 132. The fin assembly 130 has a non-flat end facing the fan 120. For example, the non-flat end is an indentation 134 or a concave end 134. The indentation 134 or concave end 134 is corresponding to the spindle 129 of the fan 120 and spaced from the fan 120 by a predetermined distance. The airflow guiding cover 140 is disposed on the fin assembly 130. The airflow guiding cover 140 is gradually expanded and extended from the fan 120 to cover the fin assembly 130.

The airflow guiding cover 140 further comprises two engaging portions 142. The engaging portions 142 are disposed on opposite sides of the airflow guiding cover 140, respectively. The engaging portions 142 are used to engage with a CPU (not shown) disposed on a main board (not shown).

In addition, two L-like engaging portions 146 are formed on opposite sides of the bottom of the airflow guiding cover 140. The two L-like engaging portions 146 are engaged with two concave grooves 114 of the base 110, respectively. Thus, the airflow guiding cover 140 is fitted on the base 110.

Additionally, two engaging protrusions 144 are disposed on opposite sides of the opening of the airflow guiding cover 140, respectively, for engaging with the fan to prevent the fan from vibration. Then, the fan 120 can be fixed to the airflow guiding cover 140 by two bolts 122.

As mentioned above, the airflow guiding cover 140 is gradually expanded and extended from the fan 120 to cover the fin assembly 130. Further, the front portion (the portion facing the fan 120) of the fin assembly 130 is formed with a preferred concave end 134. Thus, a better regulating distance, the duct length to make the airflow distribute uniformly, is provided without extending the distance between the fin assembly 130 and the fan 120 or extending the airflow guiding cover 140. In addition, the volume of the fins 132 partially located in the circulation zone can be reduced due to the preferred concave end 134. Thus, the volume of the fins 132 having the worst thermal exchange performance is reduced. Further, the wind shear noise and the weight of the side-exhaust heat dissipation module 100 are reduced.

Figure 9:
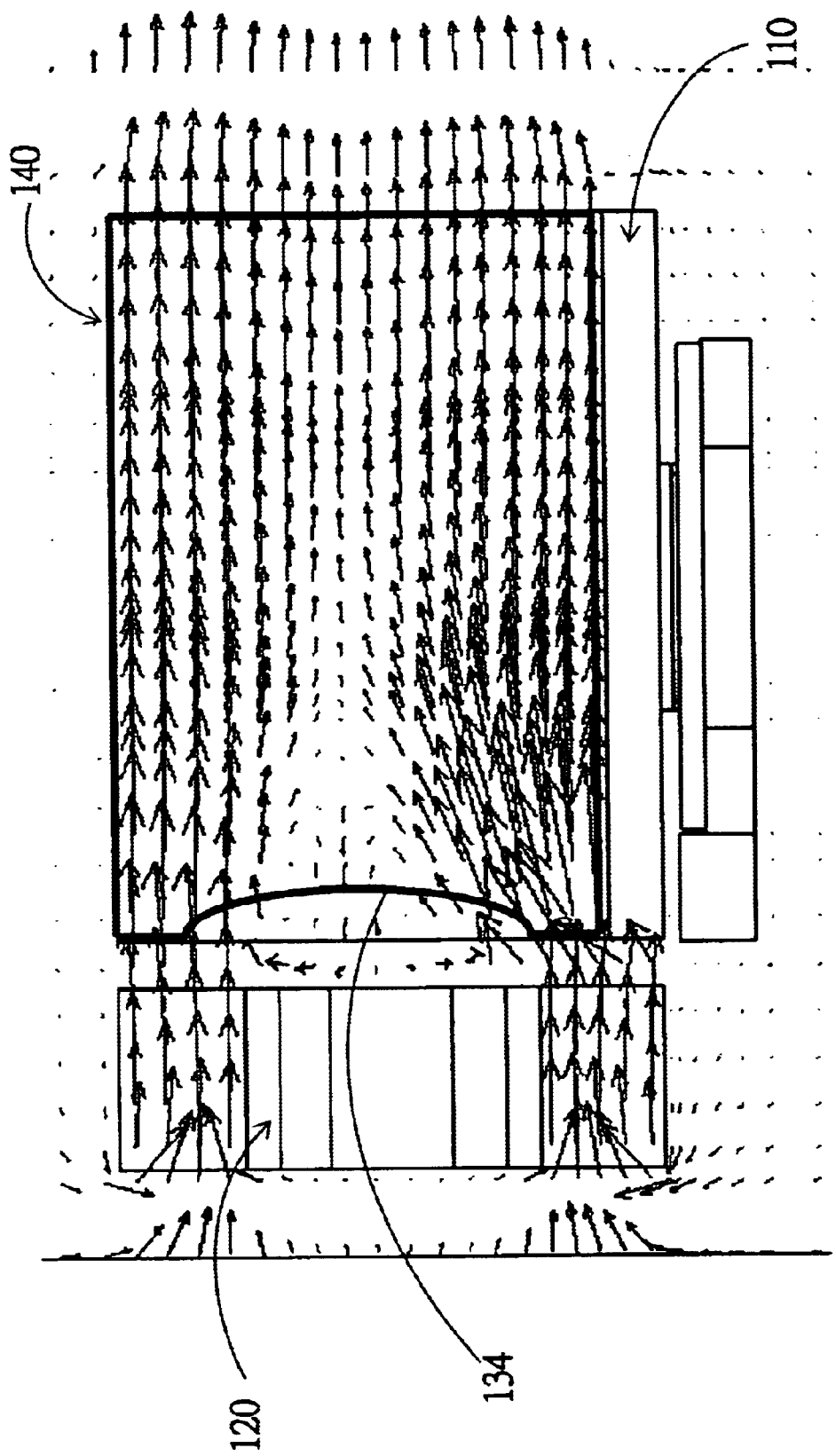
FIG. 9 shows the heat flow simulation analysis of the present side-exhaust heat dissipation module.

FIG. 9 shows the heat flow simulation analysis of the present side-exhaust heat dissipation module 100. The circulation in the central portion of the fin assembly 130 is obviously reduced.

To conclude, the advantages of the present side-exhaust heat dissipation module 100 having the airflow guiding cover 140 and the fin assembly 130 are described as follows.

(1) The airflow guiding cover 140, gradually expanded and extended from the fan 120 to cover the fin assembly 130, can prevent airflow loss and concentrate the airflow on the fins 132.

(2) The concave end 134 of the fin assembly 130 in combination with the airflow guiding cover 140 can uniform airflow distribution and prevent airflow circulation. In addition, the effective area of heat dissipation is increased and the wind shear noise created by the airflow flowing through the fins 132 is reduced.

(3) Because the airflow guiding cover 140 gradually expand and extend from the fan 120, when the number of the fins 132 is increased to enhance thermal conduction, the airflow from the fan 120 can flow through the entire array of fins 132. Thus, the efficiency of heat dissipation is enhanced.

Second Embodiment

The same elements are denoted by the same symbols.

Figure 10:
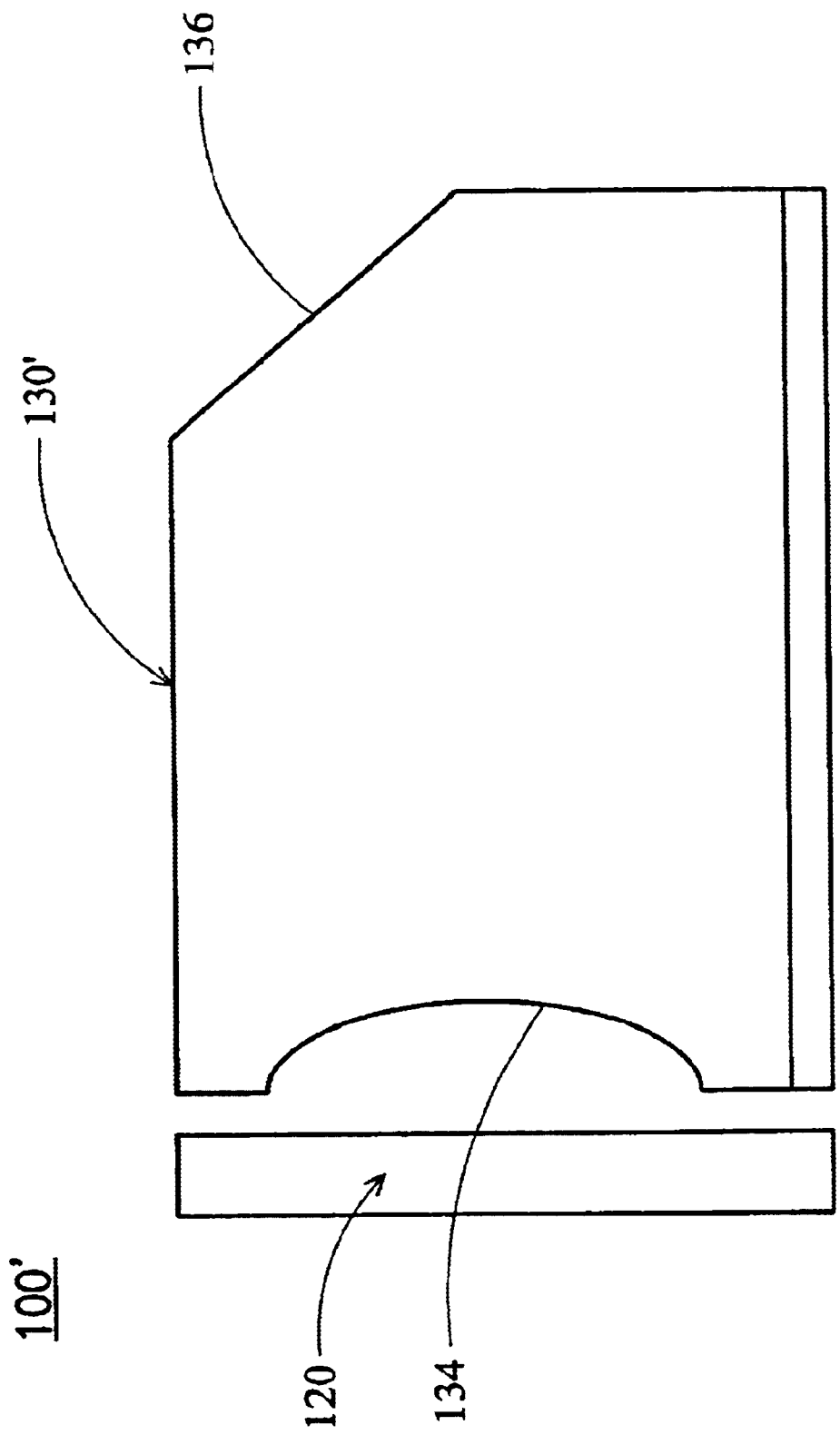
FIG. 10 is a schematic side view showing the rear inclined end of the fin assembly of the invention.

Referring to FIG. 10, In addition to the above detailed description of the side-exhaust heat dissipation module 100, the side-exhaust heat dissipation module 100' of this embodiment comprises a fin assembly 130' having an inclined end 136. The inclined end 136 is formed opposite to the concave end 134.

As shown in FIG. 7 and FIG. 8, since the thermal exchange performance in the upper rear portion of the fin assembly 130 is inferior, the fin assembly 130' provides the inclined end 136 to reduce airflow resistance over there. Thus, the amount of the airflow from the fan 120 can be increased and thus the efficiency of heat dissipation is enhanced. Further, the weight of the fin assembly 130' is reduced.

While the invention has been described by way of example and in terms of the preferred embodiment, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A side-exhaust heat dissipation module, comprising:

a base having at least one concave groove formed thereon;

a fan disposed on one side of the base;

a fin assembly disposed on the base and composed of a plurality of parallel fins, the fin assembly having a concave end spaced from the fan by a predetermined distance; and an airflow guiding cover disposed on the fin assembly and having at least one L-like engaging portion formed on the portion thereof, wherein the airflow guiding cover is gradually expanded and extended from the fan to cover the fin assembly, and the L-like engaging portion is engaged with the concave groove of the base.

2. The side-exhaust heat dissipation module as claimed in claim 1, wherein the fin assembly further comprises an inclined end opposite to the concave end.

3. The side-exhaust heat dissipation module as claimed in claim 1, further comprising two engaging portions disposed on opposite sides of the airflow guiding cover, respectively, for engaging with an electronic device.

4. The side-exhaust heat dissipation module as claimed in claim 1, wherein the airflow guiding cover is engaged with the base.

5. The side-exhaust heat dissipation module as claimed in claim 1, wherein the airflow guiding cover further comprises two engaging protrusions for engaging with the fan to prevent the fan from vibration.

6. The side-exhaust heat dissipation module as claimed in claim 1, wherein the fin assembly is attached to the base by heat conducting glue.

7. The side-exhaust heat dissipation module as claimed in claim 1, wherein the fin assembly is welded on the base.

8. The side-exhaust heat dissipation module as claimed in claim 1, wherein the base and the fin assembly are made of copper.

9. The side-exhaust heat dissipation module as claimed in claim 1, wherein the base and the fin assembly are made of aluminum.

10. A side-exhaust heat dissipation module, comprising:

a base having at least one concave groove formed thereon;

a fan disposed on one side of the base and having a spindle; and a fin assembly disposed on the base and composed of a plurality of fins, wherein the fins have non-flat ends facing the fan.

11. The side-exhaust heat dissipation module as claimed in claim 10, further comprising an airflow guiding cover disposed on the fin assembly and having at least one L-like engaging portion formed on the bottom thereof, wherein the airflow guiding cover is gradually expanded and extended from the fan to cover the fin assembly, and the L-like engaging portion is engaged with the concave groove of the base.

12. The side-exhaust heat dissipation module as claimed in claim 10, wherein the non-flat ends of the fins are indentations.

13. The side-exhaust heat dissipation module as claimed in claim 10, wherein the non-flat ends of the fins are concave ends.

14. The side-exhaust heat dissipation module as claimed in claim 12, wherein the indentations are spaced from the fan by a predetermined distance.

15. The side-exhaust heat dissipation module as claimed in claim 13, wherein the concave ends are spaced from the fan by a predetermined distance.

16. The side-exhaust heat dissipation module as claimed in claim 12, wherein the indentations are corresponding to the spindle of the fan.

17. The side-exhaust heat dissipation module as claimed in claim 13, wherein the concave ends are corresponding to the spindle of the fan.

18. The side-exhaust heat dissipation module as claimed in claim 10, wherein the fin assembly is composed of a plurality of parallel fins.

* * * * *